(12) United States Patent
Wakamatsu

(10) Patent No.: US 10,117,338 B2
(45) Date of Patent: Oct. 30, 2018

(54) METHOD FOR MANUFACTURING LIGHT EMITTING DEVICE

(71) Applicant: NICHIA CORPORATION, Anan-shi, Tokushima (JP)

(72) Inventor: Dai Wakamatsu, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/977,701

(22) Filed: May 11, 2018

(65) Prior Publication Data

US 2018/0263120 A1    Sep. 13, 2018

Related U.S. Application Data

(63) Continuation of application No. 15/841,625, filed on Dec. 14, 2017, now Pat. No. 10,004,146.

(30) Foreign Application Priority Data

Dec. 20, 2016   (JP) .................................. 2016-246996

(51) Int. Cl.
   *H05K 3/30*    (2006.01)
(52) U.S. Cl.
   CPC ................... *H05K 3/303* (2013.01)
(58) Field of Classification Search
   CPC .................. H05K 3/303; H05K 3/30
   See application file for complete search history.

(56) References Cited

U.S. PATENT DOCUMENTS

| | | | | |
|---|---|---|---|---|
| 5,133,118 | A | * | 7/1992 | Lindblad .............. H05K 3/0097 174/559 |
| 5,386,626 | A | * | 2/1995 | Cheng .................... H05K 3/301 228/180.22 |
| 5,791,484 | A | | 8/1998 | Ikeda et al. |
| 5,791,494 | A | * | 8/1998 | Meyer ....................... B07B 1/42 209/365.3 |
| 5,844,330 | A | * | 12/1998 | Furukawa ................ H01G 2/14 307/100 |
| 5,870,289 | A | * | 2/1999 | Tokuda ............... H01L 21/6835 174/260 |

(Continued)

FOREIGN PATENT DOCUMENTS

| | | |
|---|---|---|
| JP | 2012-079776 A | 4/2012 |
| JP | 2013-012545 A | 1/2013 |

(Continued)

*Primary Examiner* — Anne Hines

(57) ABSTRACT

A method for manufacturing a light emitting device includes: joining a light transmissive substrate and two or more light emitting elements; separating the light transmissive substrate into a plurality of light transmissive pieces such that one or more of the light emitting elements remains in a state joined to one of the light transmissive pieces; mounting the one or more of the light emitting elements joined to the one of the light transmissive pieces on a mounting unit; removing a portion of the one of the light transmissive pieces such that a top surface of the one of the light transmissive pieces becomes a predetermined shape; and after the removing of the portion of the one of the light transmissive pieces, separating the mounting unit into a plurality of board pieces such that one or more of the light transmissive pieces remain on one of the board pieces.

18 Claims, 12 Drawing Sheets

(56) References Cited

U.S. PATENT DOCUMENTS 6,169,325 B1 * 1/2001 Azuma ................ H01L 25/105
257/685

FOREIGN PATENT DOCUMENTS

| JP | 2014-110333 A | 6/2014 |
|----|---------------|--------|
| JP | 2015-201665 A | 11/2015 |
| JP | 2016-115703 A | 6/2016 |
| WO | 2014-081042 A1 | 5/2014 |

* cited by examiner

METHOD FOR MANUFACTURING LIGHT EMITTING DEVICE

CROSS-REFERENCE TO RELATED APPLICATIONS

This application is a continuation application of U.S. patent application Ser. No. 15/841,625 filed on Dec. 14, 2017. This application claims priority to Japanese Patent Application No. 2016-246996 filed on Dec. 20, 2016. The entire disclosures of U.S. patent application Ser. No. 15/841,625 and Japanese Application No. 2016-246996 are hereby incorporated herein by reference.

BACKGROUND

The present invention relates to a method for manufacturing a light emitting device.

With the method for manufacturing a light emitting device noted in Japanese Laid-Open Patent Application Publication No. 2012-079776, a phosphor layer comprising resin is joined on the top surface of a plurality of light emitting elements, after which the phosphor layer is cut to match the size of the light emitting elements, dividing into individual light emitting elements. Then, after the obtained light emitting elements are fixed to the top surface of a mounting board block, this is divided to obtain the light emitting device (see FIG. 3 in Japanese Laid-Open Patent Application Publication No. 2012-079776, for example).

SUMMARY

In recent years, as light emitting device output increases, providing one plate-shaped light transmissive substrate comprising ceramic on the top surface of a plurality of light emitting elements is being considered, for example. Joining while pressing at the junction of the plurality of light emitting elements and the light transmissive substrate is conceivable, but due to the light emitting elements misalignment from the predetermined position, there are cases when the light emitting elements are joined shifted from the predetermined position on the light transmissive substrate. When the light transmissive substrate is cut in this state, and the light emitting element joined to a light transmissive piece obtained after cutting is mounted on a mounting unit, when the light emitting device is seen from the light emitting surface side, there is a probability of variance occurring in the shape of the light transmissive piece on each mounting unit. Furthermore, when the light reflective member is arranged in this state, when the light emitting device is seen from the light emitting surface side, for each light emitting device, variance occurs in the relative positional relationship of the top surface of the light transmissive piece that is to be the light emitting surface and the outer edge of the mounting unit. As a result, there is a probability of a decreased yield of the light emitting devices.

A method for manufacturing a light emitting device according to the present disclosure includes: joining a light transmissive substrate and two or more light emitting elements with top surfaces of the light emitting elements facing a bottom surface of the light transmissive substrate; separating the light transmissive substrate into a plurality of light transmissive pieces such that one or more of the light emitting elements remains in a state joined to one of the light transmissive pieces after separation; mounting the one or more of the light emitting elements joined to the one of the light transmissive pieces on a mounting unit, with a bottom surface of the one or more of the light emitting elements facing a top surface of the mounting unit; removing a portion of the one of the light transmissive pieces joined with the one or more of the light emitting elements mounted on the mounting unit such that a top surface of the one of the light transmissive pieces becomes a predetermined shape; and after the removing of the portion of the one of the light transmissive pieces, separating the mounting unit into a plurality of board pieces such that one or more of the light transmissive pieces remain on one of the board pieces after separation.

Thereby, even when positional misalignment occurs during joining of the light transmissive substrate and the light emitting elements, it is possible to reduce the variance in the relative positional relationship of the top surface of the light transmissive piece that is to be the light emitting surface and the outer edge of the mounting unit. Therefore, it is possible to prevent a decrease in manufacturing yield of the light emitting device.

DETAILED DESCRIPTION OF EMBODIMENTS

Certain embodiments for carrying out the invention are explained hereafter while referring to drawings. However, the embodiments shown hereafter are for embodying the technical concepts of the present invention, and do not limit the present invention. The size, positional relationship, etc. of the members shown in each drawing may be exaggerated to clarify the explanation. Also, the vertical relationship in each drawing is relative, and is not absolute. For example, in this specification, the light extraction surface side of a light emitting element 10 (upward in FIG. 2, for example) is the upper side, and the reverse side to that (downward in FIG. 2, for example) is the lower side, but it is obvious that even if the vertical relationship of the drawings is inverted, it is within the scope of the invention.

First Embodiment

Figure 1:
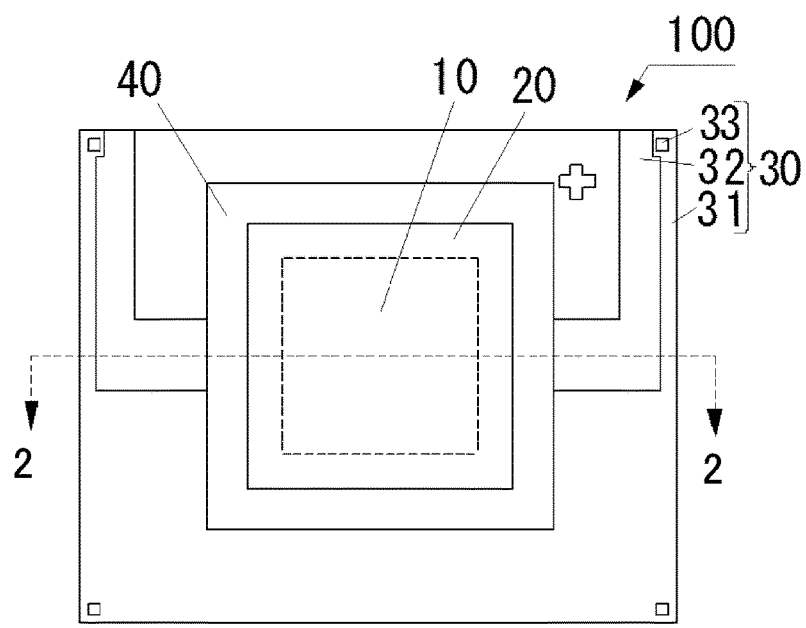
FIG. 1 is a top view of a light emitting device manufactured using the manufacturing method of a first embodiment.
Figure 2:
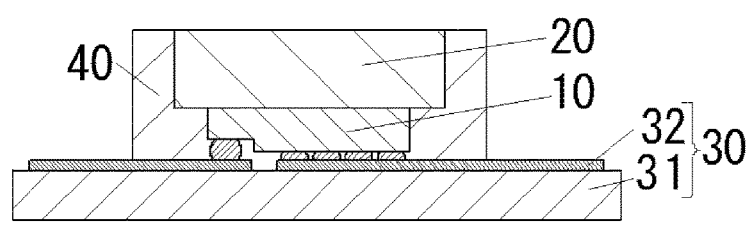
FIG. 2 is a cross section view of the light emitting device taken along a line 2-2 of FIG. 1.
Figure 3A:
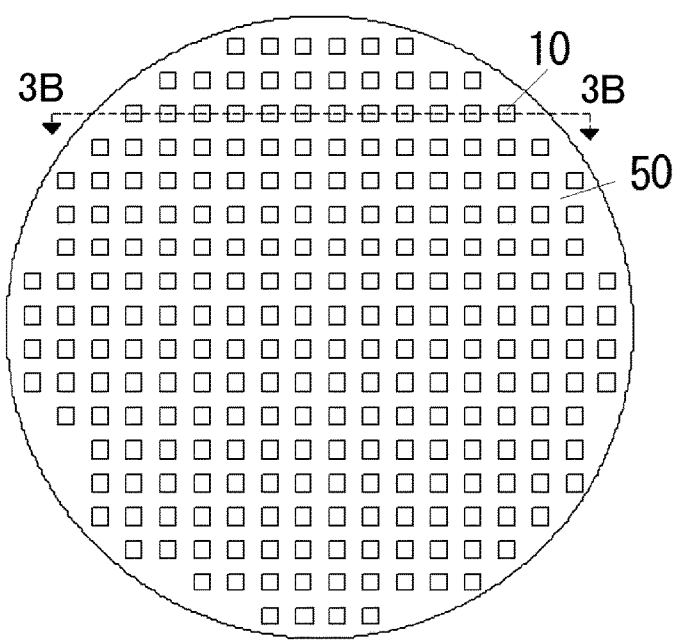
FIG. 3A is a top view for illustrating the method for manufacturing a light emitting device of the first embodiment.

FIG. 1 shows a top view of a light emitting device 100 obtained using the manufacturing method of the present embodiment, and FIG. 2 shows a cross section view of line 2-2 in FIG. 1. Also, FIG. 3A to FIG. 3P are drawings for illustrating the method for manufacturing the light emitting device 100.

The method for manufacturing the light emitting device 100 includes: joining a light transmissive substrate 20a and two or more light emitting elements 10 with the bottom surface of the light transmissive substrate 20a and the respective top surfaces of the two or more light emitting elements 10 facing each other; separating the light transmissive substrate 20a into a plurality of light transmissive pieces 20, being a step of separating the light transmissive substrate 20a into a plurality of light transmissive pieces 20 such that after separation, one or more of the light emitting elements 10 remain in a state joined to one of the light transmissive pieces 20; mounting the one or more of the light emitting elements 10 joined to the one of the light transmissive pieces 20 on a mounting unit 30, with a bottom surface of the one or more light emitting elements 10 and the top surface of the mounting unit 30 facing each other, removing a portion of the one of the light transmissive pieces 20 joined with the one or more of the light emitting elements 10 mounted on the mounting unit 30, being a step of removing a portion of the light transmissive piece 20 such that a top surface of the one of the light transmissive pieces 20 becomes a predetermined shape; and providing a light reflective member 40 around the top surface of the one of the light transmissive pieces 20 that remains after the portion of the one of the light transmissive piece 20 is removed.

Accordingly, even if mounting misalignment occurs during joining of the light transmissive substrate 20a and the light emitting element 10, the light transmissive piece 20 can be processed to match the mounting unit 30, thereby enabling a decrease in manufacturing yield of the light emitting device 100. A detailed description follows.

As a method for joining two or more light emitting elements and the light transmissive substrate, for example, a method is possible of, after temporarily fixing the two or more light emitting elements on a support substrate, etc., joining the two or more light emitting elements and the light transmissive substrate while pressing either or both of the support substrate and the light transmissive substrate. When temporarily fixing the two or more light emitting elements on the support substrate, it is preferable to not completely fix the light emitting elements and the support substrate in order to make it easier to remove the support substrate later. Pressing and joining the light transmissive substrate in this state may lead movement of the light emitting elements from the predetermined position, and the light emitting elements are joined at shifted from the desired position to the light transmissive substrate. Using a light transmissive piece made by the light transmissive substrate being cut in this state, when the light emitting element joined to the light transmissive piece is mounted on the mounting unit, the positional relationship of the mounting unit and the light transmissive piece may be changed for each light emitting device. Thus, there is a possibility of a decrease in yield of the light emitting devices.

In contrast to this, with the method for manufacturing a light emitting device of the present embodiment, after the light emitting element 10 to which the light transmissive piece 20 is joined is mounted on the mounting unit 30, a portion of the light transmissive piece 20 is removed in order to make the top surface of the light transmissive piece 20 (i.e., surface to be the light emitting surface) be a desired shape. Thereby, even if positional misalignment occurs for any reason during joining of the light transmissive piece 20 and the light emitting element 10, it is possible to reduce variance of the relative positional relationship of the top surface of the light transmissive piece 20 and the outer edge of the mounting unit 30 before disposing the light reflective member 40. Therefore, it is possible to suppress a decrease in yield of the light emitting device 100. Also, with the variance in the positional relationship of the top surface of the light transmissive piece and the mounting unit, in the case where combining optical components such as lenses to make an optical device, the optical characteristics according to the design for the optical device may not be obtained. In contrast to this, with the method for manufacturing a light emitting device of the present embodiment, it is possible to make the final positional relationship of the top surface of the light transmissive piece 20 and the mounting unit 30 constant in each of the light emitting elements, thereby allowing the light emitting device to have an optical device for which optical characteristics according to the design.

Following is an explanation of each step of the present embodiment based on FIG. 3A to FIG. 3P.

Temporarily Fixing Light Emitting Elements 10 on Support Substrate 60

Figure 3B:
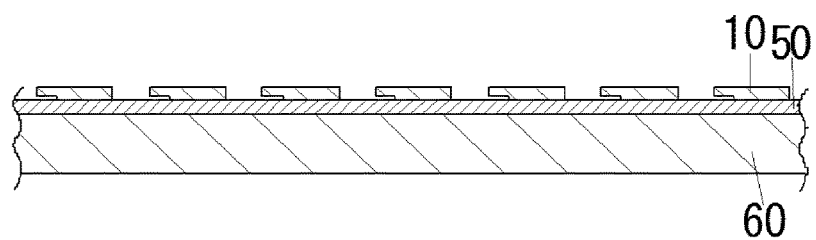
FIG. 3B is a cross section view taken along a line 3B-3B of FIG. 3A.

With the present embodiment, first, as shown in FIG. 3A and FIG. 3B, two or more light emitting elements 10 are temporarily fixed on the support substrate 60 with the bottom surface of each of the two or more light emitting elements 10 facing the top surface of the support substrate 60. At this time, a resin 50 is arranged between the bottom surface of the light emitting elements 10 and the top surface of the support substrate 60. By arranging the resin 50 between the bottom surfaces of the light emitting elements 10 and the top surface of the support substrate 60, the light emitting elements 10 can be temporarily fixed using the stickiness of the resin 50.

With the present embodiment, silicone resin is used as the resin 50. This is because silicone resin is a soft material with relatively high stickiness among resins. Provided it has a certain degree of stickiness and softness, a material other than silicone resin can also be used.

The resin 50 can be arranged at a thickness preferably in a range of from 15 μm to 50 μm, and more preferably in a range of from 25 μm to 40 μm. Having a thickness of the above-mentioned lower limit value or greater allows the light emitting element 10 to be less likely to be damaged during joining the light transmissive substrate 20a and the light emitting elements 10. Also, having a thickness of the above-mentioned upper limit value or less realize reduction in the amount of the resin 50 formed on the top surface of the support substrate 60.

Among the two or more light emitting elements 10 joined to the one light transmissive substrate 20a, it is preferable to make a difference small between the height (i.e., thickness in the vertical direction) of one of the light emitting elements 10 and the height of the other light emitting element 10. This can easily reduce variance in joining strength between the light emitting elements 10 and the light transmissive substrate 20a, and can easily reduce mounting misalignment of the light emitting elements 10 with respect to the light transmissive substrate 20a. On the one hand, when the acceptable range of difference in height of the light emitting elements 10 is made too small, the light emitting elements 10 outside the acceptable range are recognized to be defective, resulting in a decrease in yield of the light emitting elements 10. Whereas, with the present embodiment, the adverse effect due to mounting misalignment of the light emitting elements 10 can be reduced, thereby allowing the acceptable range of the difference in heights of the light emitting elements 10 to be large.

In the present embodiment, light emitting elements that having the top surfaces are substantially flat respectively, are used for the light emitting elements 10. This can facilitate joining of the top surface of the light emitting elements 10 and the bottom surface of the light transmissive substrate 20a. Also, with the present embodiment, each of the light emitting elements 10, in which a first electrode and a second electrode are provided on the bottom surface side, are used.

The distance between one light emitting element 10 and the adjacent light emitting element 10 can be preferably in a range of from 100 μm to 500 μm, and more preferably in a range of from 200 μm to 400 μm. Having a distance of the above-mentioned lower limit value or greater can reduce the breakage of the light emitting element 10 when separating the light transmissive substrate 20a into light transmissive pieces 20. Having a distance of the above-mentioned upper limit value or less can increase the number of light emitting elements 10 which can be joined to one light transmissive substrate 20a.

In the present embodiment, two or more light emitting elements 10 are temporarily fixed on the support substrate 60 such that the distance between one light emitting element 10 and the adjacent light emitting element 10 is constant. The disclosure is not limited to this, and it is also possible to temporarily fix the two or more light emitting elements 10 to the support substrate 60 such that the distance between one light emitting element 10 and the adjacent light emitting element 10 is different from the distance between the other light emitting element 10 and the adjacent light emitting element 10. For example, when separating the light transmissive substrate 20a into a plurality of light transmissive pieces 20 such that after separation, the two or more light emitting elements 10 remain in a state joined to the one light transmissive piece 20, it is possible to set the distance between the light emitting elements 10 joined to one light transmissive piece 20 and the light emitting elements 10 joined to the adjacent light transmissive piece 20 be greater than the distance between the two or more light emitting elements 10 joined to one light transmissive piece 20.

In the present embodiment, an electrically conductive silicon wafer is used as the support substrate 60. In the present embodiment, the light transmissive substrate 20a and the two or more light emitting elements 10 are joined using the surface activated bonding method, and the support substrate 60 is held using an electrostatic chuck. The electrostatic chuck has a high gripping force on electrically conductive materials, therefore, gripping force for the support substrate 60 can be easily enhanced by using the electrically conductive silicon wafer. When using the electrostatic chuck, the support substrate 60 can employ materials other than the silicon wafer, for example, a sapphire wafer provided with a metal film.

Joining the Light Transmissive Substrate 20a and Two or More Light Emitting Elements 10

Figure 3C:
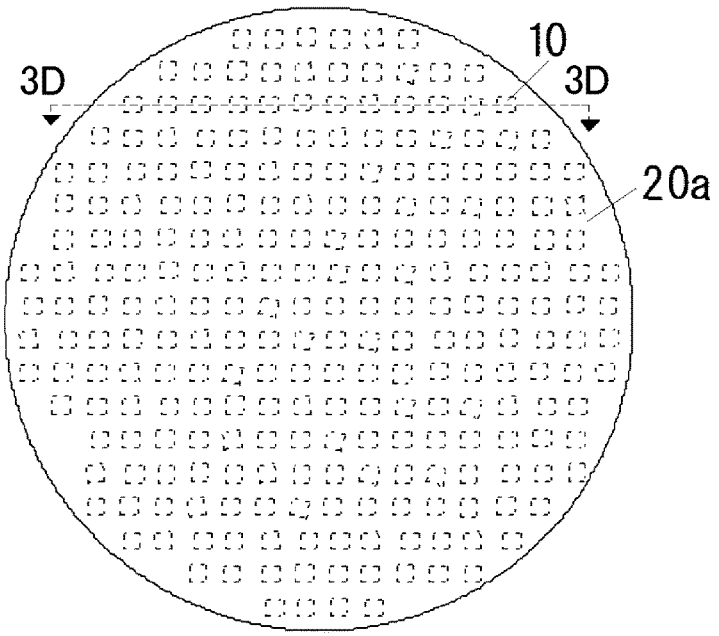
FIG. 3C is a top view for explaining the method for manufacturing a light emitting device of the first embodiment.
Figure 3D:
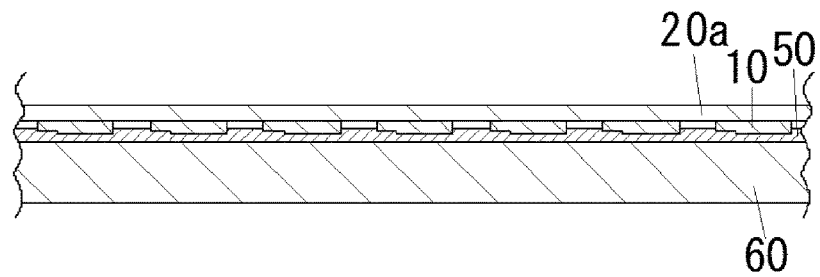
FIG. 3D is a cross section view taken along a line 3D-3D of FIG. 3C.

Subsequently, as shown in FIG. 3C and FIG. 3D, the light transmissive substrate 20a and two or more light emitting elements 10 are joined with the bottom surface of the light transmissive substrate 20a and the top surfaces of respective of the two or more light emitting elements 10 facing each other. When using the surface activated bonding method for joining as with the present embodiment, the bottom surface of the light transmissive substrate 20a is required to be adhered to the top surfaces of respective of the light emitting elements 10, both members are necessarily joined with certain degrees of pressure. For example, pressure of in a range of from 30 N/mm$^2$ to 150 N/mm$^2$ is necessary. In this case, among the two or more light emitting elements 10, the light emitting element 10 having the greater height more easily is in contact with the light transmissive substrate 20a, thereby facilitating joining at a predetermined position. The light emitting element 10 having a lower height is however, less likely to be in contact with the light transmissive substrate 20a, and moves by the repulsion of the resin 50, therefore, a misalignment of the light emitting element 10 from the predetermined position is easily occur during joining. When using the atomic diffusion bonding method as the joining method of the light transmissive substrate 20a and the two or more light emitting elements 10 as well, it is possible to obtain the same effect. Aside from this, as the joining method of the light transmissive substrate 20a and the two or more light emitting elements 10, an adhesive agent such as resin can be used for the joining. Alternately, individual light emitting elements 10 can be joined to the light transmissive substrate 20a separately without using the support substrate 60.

In the present embodiment, ceramic substrate that contains phosphor (hereafter called "phosphor ceramic") is used for the light transmissive substrate 20a. As the phosphor ceramic, for example, a sintered body of YAG alone or a sintered body containing YAG and $Al_2O_3$.

The height of the light transmissive substrate 20a (i.e., length from the bottom surface to the top surface of the light transmissive substrate 20a in FIG. 3D) can be in a range of from 150 μm to 250 μm, for example. By making the light transmissive substrate 20a the above-mentioned lower limit value or higher, it is easier to prevent damage of the light transmissive substrate 20a when joining the light transmissive substrate 20a and the light emitting elements 10. By making the light transmissive substrate 20a the above-mentioned upper limit value or lower, adjusting the final thickness of the light transmissive substrate 20a can be eliminated.

In the present embodiment, the light transmissive substrate 20a of which top surface is a mirror surface is used. With the light transmissive substrate 20a of which top surface is a rough surface, luminance is decreased because the light is scattered at the top surface of the light transmissive substrate 20a. By using the light transmissive substrate 20a of which top surface is a mirror surface, it is possible to more easily reduce the spreading of the light output to outside from the light transmissive piece 20, compared to when using the light transmissive substrate 20a of which the top surface is a rough surface. This can readily prevent a decrease in the luminance of the light emitting device 100.

Removing Support Substrate 60

Figure 3E:
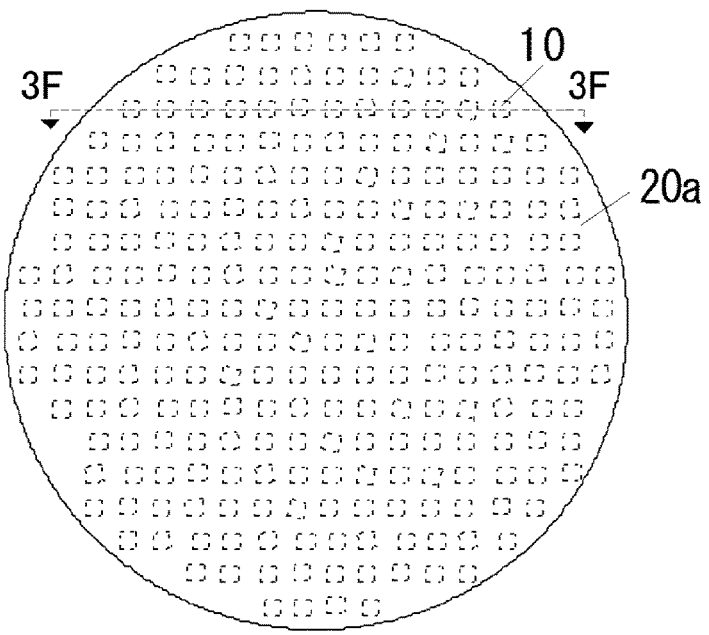
FIG. 3E is a top view for illustrating the method for manufacturing a light emitting device of the first embodiment.
Figure 3F:
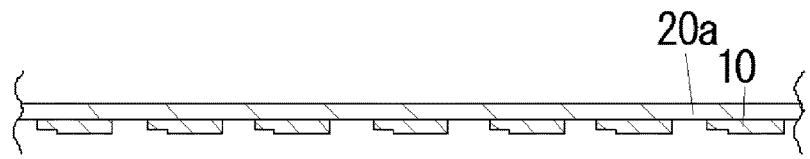
FIG. 3F is a cross section view taken along a line 3F-3F of FIG. 3E.

Subsequently, the support substrate 60 is removed as shown in FIG. 3E and FIG. 3F. The support substrate 60 and the two or more light emitting elements 10 are fixed using only the adhesiveness of the resin 50, it is possible to easily peel the support substrate 60 and the resin 50 from the light transmissive substrate 20a. When the resin 50 remains on the light emitting elements 10, the light emitting elements 10 can be cleaned to remove the remaining resin 50.

Separating Light Transmissive Substrate 20a into Light Transmissive Pieces 20

Figure 3G:
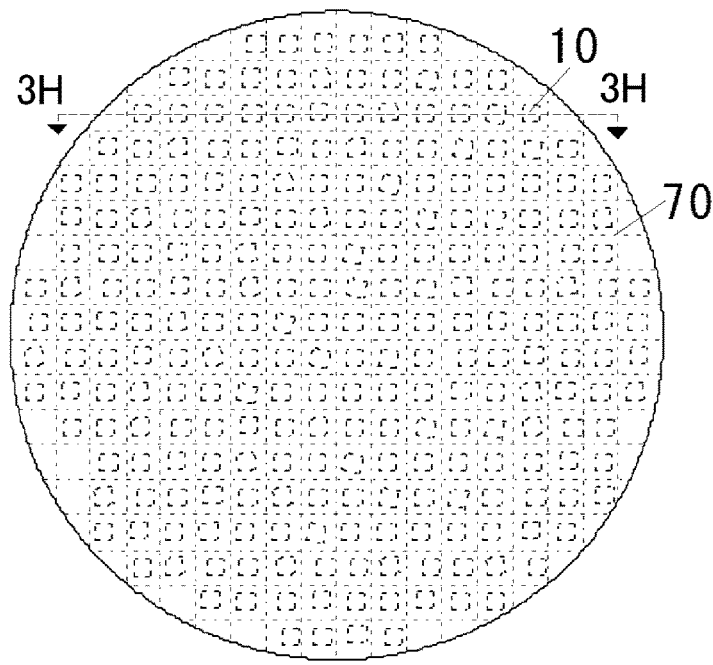
FIG. 3G is a top view for illustrating the method for manufacturing a light emitting device of the first embodiment.
Figure 3H:
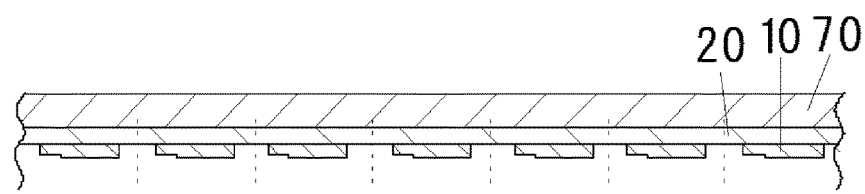
FIG. 3H is a cross section view taken along a line 3H-3I of FIG. 3G.

Subsequently, the top surface of the light transmissive substrate 20a and an adhesive sheet 70 are adhered to each other as shown in FIG. 3G and FIG. 3H. Also, as shown by the dotted lines in FIG. 3H, the light transmissive substrate 20a is separated into a plurality of light transmissive pieces 20 such that the one or more light emitting elements 10 after separation remain in a state joined to the one light transmissive piece 20. With the present embodiment, from the bottom surface side of the light emitting element 10, the light transmissive substrate 20a is separated into a plurality of light transmissive pieces 20 using a blade, and one light emitting element 10 remains in a joined state to one light transmissive piece 20. Also, in the present embodiment, rather than cutting through the entire thickness direction of the adhesive sheet 70, cutting is stopped midway in the adhesive sheet 70. This enables holding the plurality of separated light transmissive pieces 20 on the adhesive sheet 70, thereby realizing easy handling thereafter. In FIG. 3G, to make the position of the light emitting elements 10 easier to see, the light emitting elements 10 are shown with dotted lines. Also, to make the separation parts of the light transmissive substrate 20a easier to see, the separation parts are shown with dotted lines.

As described above, when joining the light emitting elements to the light transmissive substrate, the light emitting elements may be shifted from the predetermined position. In this case, when separating the light transmissive substrate into a plurality of light transmissive pieces in a latter step, it is also possible to cut the light transmissive substrate and separate it into light transmissive pieces such that the positional relationship of the outer edge of the light transmissive pieces and the outer edge of the light emitting element is the same for each separated light transmissive piece. However, adjustment of the cutting pattern for each individual light transmissive pieces is complex, and is not practical. In contrast to this, in the present embodiment, it is not necessary to worry about the positional relationship of the light transmissive piece 20 and the light emitting element 10 during separation, which is convenient. In this step, by adjusting the position for separating the light transmissive substrate 20a, the two or more light emitting elements 10 remain joined on the one light transmissive piece 20. As the adhesive sheet 70, UV tape can be used, for example.

Mounting Light Emitting Elements 10 on Mounting Unit 30

Figure 3I:
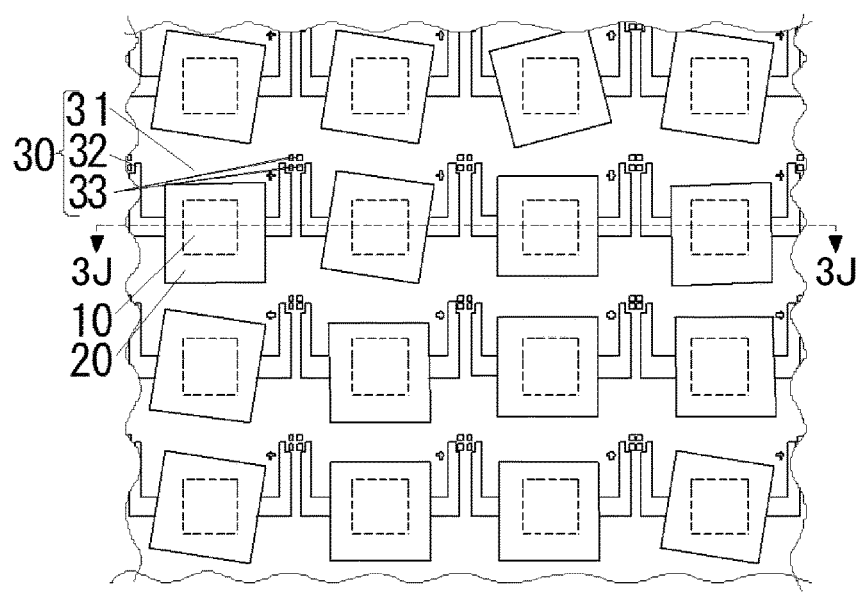
FIG. 3I is an enlarged partial top view for illustrating the method for manufacturing a light emitting device of the first embodiment.
Figure 3J:
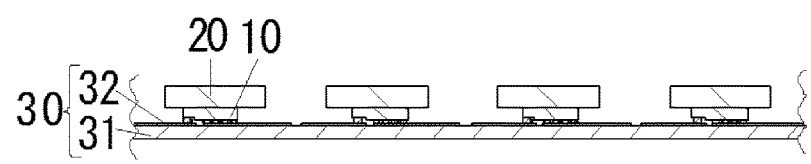
FIG. 3J is a cross section view taken along a line 3J-3J of FIG. 3I.

Subsequently, as shown in FIG. 3I and FIG. 3J, the one or more light emitting elements 10 joined to the one light transmissive piece 20 is mounted on the mounting unit 30 with the bottom surface of the one or more light emitting elements 10 and the top surface of the mounting unit 30 facing each other. In the present embodiment, each of the light emitting elements 10 are mounted on the mounting unit 30 such that the first electrode and second electrode side of the light emitting elements 10 face downward.

In the present embodiment, as the mounting unit 30, the mounting unit 30 having a main body 31, a pattern electrode 32, and recognition marks 33 is used. As the recognition marks 33, for example, alignment marks for cutting are used. Also, as the mounting unit 30, a mounting board later separated into a plurality of board pieces is used, and two or more light transmissive pieces, each of which is joined to the two or more light emitting elements, are mounted on the mounting board. In the present embodiment, a plurality of alignment marks are applied to the mounting board such that the alignment marks are positioned at four corners of the light emitting device after separating into a plurality of board pieces.

Removing Portion of Light Transmissive Piece 20

Figure 3K:
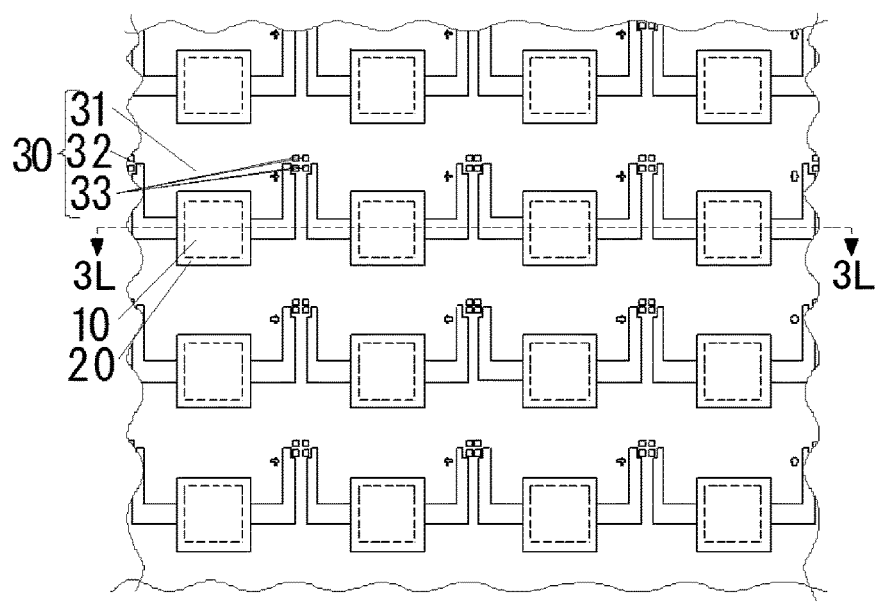
FIG. 3K is an enlarged partial top view for illustrating the method for manufacturing a light emitting device of the first embodiment.
Figure 3L:
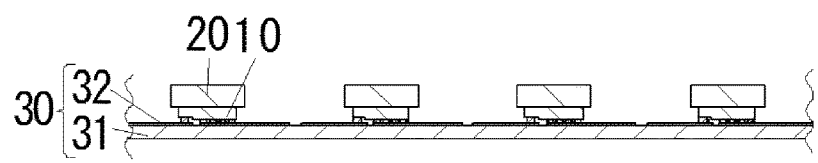
FIG. 3L is a cross section view taken along a line 3L-3L of FIG. 3K.

Subsequently, as shown in FIG. 3K and FIG. 3L, a portion of the light transmissive piece 20 joined to the one or more light emitting elements 10 mounted on the mounting unit 30 is removed. At this time, a portion of the light transmissive piece 20 is removed such that the top surface of the light transmissive piece 20 becomes a desired shape. In the present embodiment, a portion of the light transmissive piece 20 is removed such that the top surface of the light transmissive piece 20 becomes quadrangular. If the light transmissive piece 20 is polygonal, the misalignment in the positional relationship of the outer edge of the mounting unit and the outer edge of the light transmissive piece 20 tends to occur. According to the present embodiment, however, the final positional relationship of both members can be constant. The shape of the top surface of the light transmissive piece 20 is not limited to being quadrangular, and can be a desired shape.

In the present embodiment, a portion of the light transmissive piece 20 is removed using a blade. Additionally, a portion of the light transmissive piece 20 can be removed using a laser.

In the present embodiment, a portion of the light transmissive piece 20 is removed with the recognition marks 33 serving as reference. The light emitting elements 10 must be electrically connected to the pattern electrode 32 of the mounting unit 30, therefore, the positional relationship of the light emitting element 10 and the pattern electrode 32 is relatively constant. Also, since the positional relationship of the pattern electrode 32 and the recognition marks 33 does not change, by processing the light transmissive piece 20 to match the recognition marks 33, the light transmissive piece 20 can be processed to match the shapes of mounting unit 30 and the light emitting element 10. This can easily make the positional relationship of the outer edge of the mounting unit 30 and the outer edge of the light transmissive piece 20 constant.

In the present embodiment, a portion of the light transmissive piece 20 is removed such that the top surface and the bottom surface of the light transmissive piece 20 have the same areas, in other words, such that the obtained light transmissive piece 20 is a rectangular parallelepiped. A portion of the light transmissive piece 20 is also removed such that the one or more light emitting elements 10 joined to the light transmissive piece 20 is joined with the bottom surface of the light transmissive piece 20 with being maintained inside than the outer edge of the bottom surface of the light transmissive piece 20. This allows the light from the entire area of the light extraction surface of the light emitting element 10 to pass through the light transmissive piece 20, thereby enabling extraction of light from the light emitting element 10 substantially without waste.

Providing Light Reflective Member 40

Figure 3M:
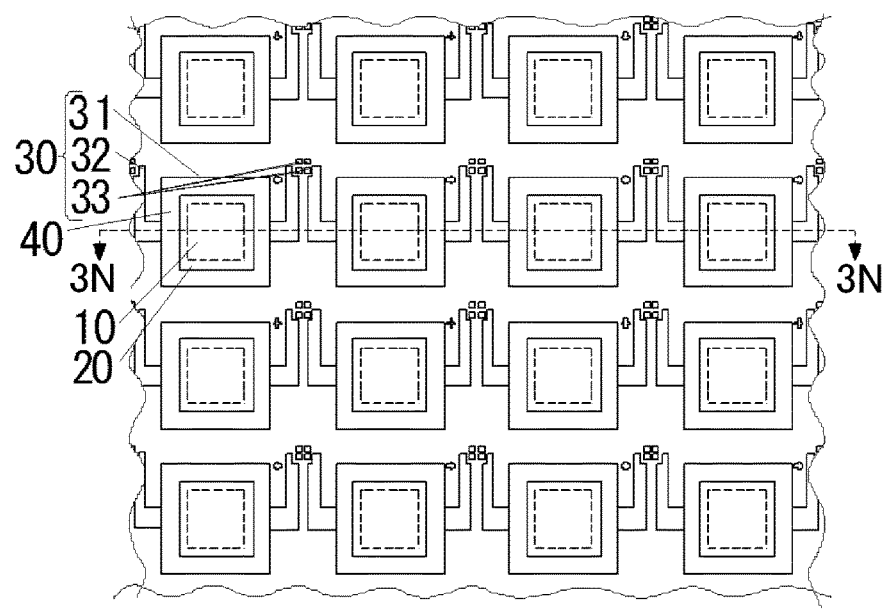
FIG. 3M is an enlarged partial top view for illustrating the method for manufacturing a light emitting device of the first embodiment.
Figure 3N:
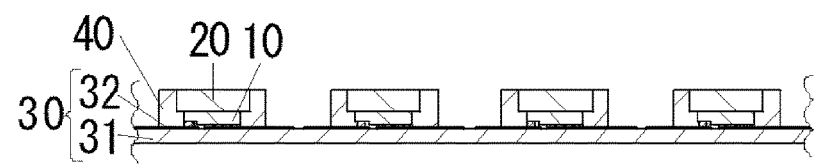
FIG. 3N is a cross section view taken along a line 3N-3N of FIG. 3M.

Subsequently, as shown in FIG. 3M and FIG. 3N, the light reflective member 40 is provided around the top surface of the light transmissive piece 20 remaining after a portion of the light transmissive piece 20 is removed, in a top view. In the present embodiment, the light reflective member 40 is a light reflective resin arranged which covers the lateral surface of the light transmissive piece 20, a portion of the bottom surface of the light transmissive piece 20, the lateral surface of the light emitting element 10, and a portion of the bottom surface of the light emitting element 10. By using light reflective member, it is possible to prevent extraction of light from areas other than the top surface of the light transmissive piece 20.

Separating Mounting Board into Board Pieces

Figure 3O:
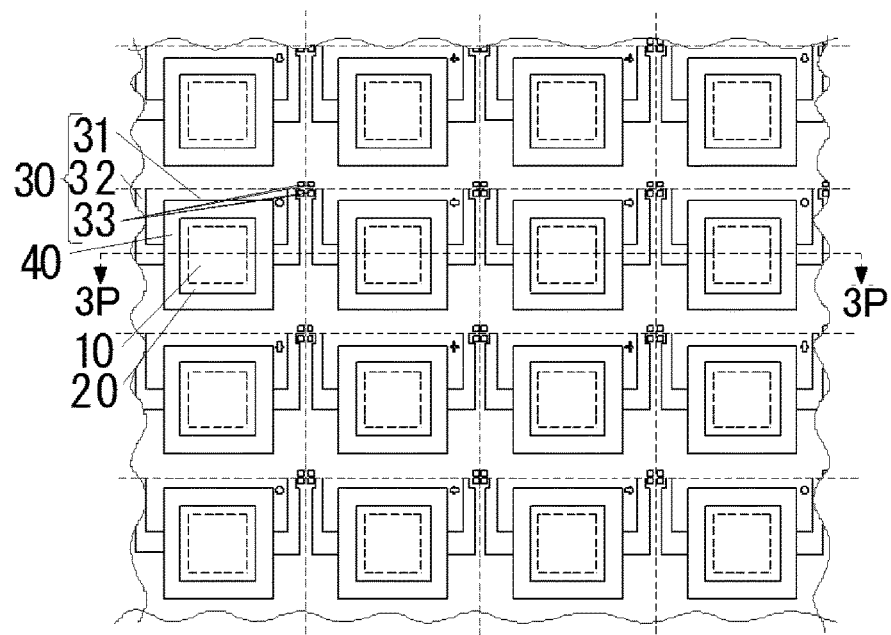
FIG. 3O is an enlarged partial top view for illustrating the method for manufacturing a light emitting device of the first embodiment.
Figure 3P:
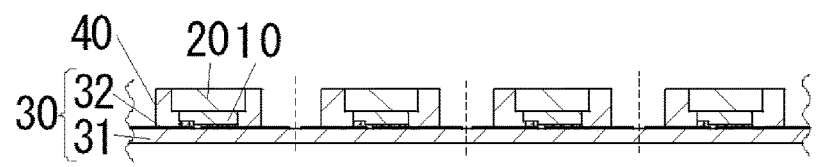
FIG. 3P is a cross section view taken along a line 3P-3P of FIG. 3O.

Subsequently, as shown in FIG. 3O and FIG. 3P, the mounting board is separated into a plurality of board pieces such that the one or more light transmissive pieces 20 will remain on the one separated board piece. This can result in the light emitting device 100 shown in FIG. 1 and FIG. 2. In the present embodiment, at the dotted lines shown in FIG. 3O and FIG. 3P, the mounting board is separated into a plurality of board pieces such that the one light emitting element 20 joined to the one light transmissive piece 20 will remain in a state mounted on the one board piece. For example, a blade can be used to separate the mounting board into a plurality of board pieces. In the present embodiment, the mounting board is separated into a plurality of board pieces after the step of arranging the light reflective members 40 in consideration for mass production, but the step of separating the mounting board into a plurality of board pieces can be performed before the step of arranging the light reflective members 40.

Second Embodiment

Figure 4:
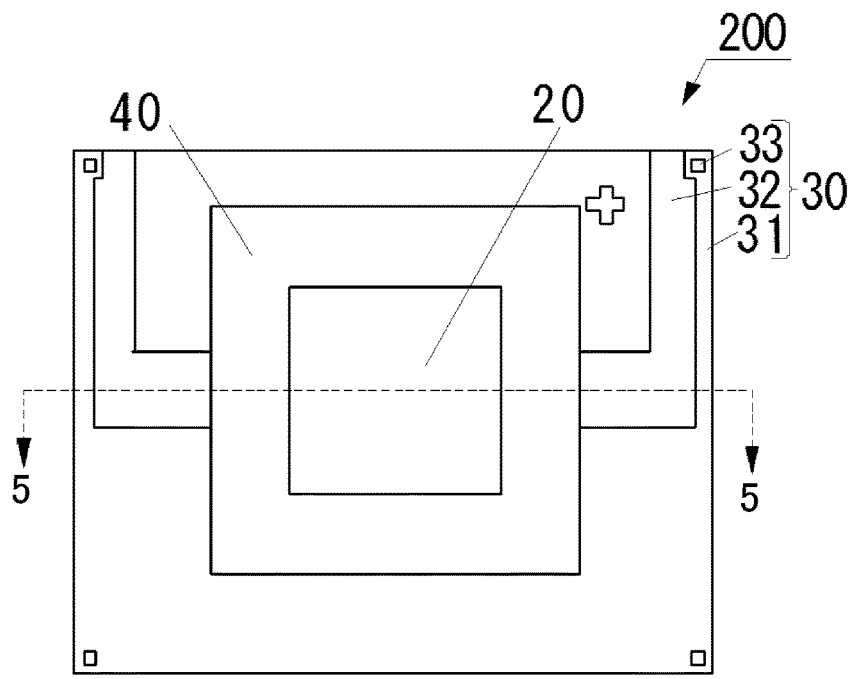
FIG. 4 is a top view of a light emitting device manufactured using the manufacturing method of a second embodiment.
Figure 5:
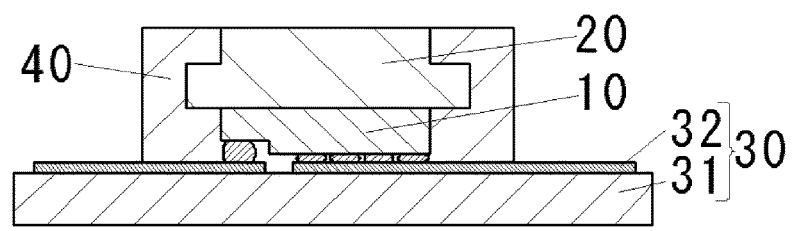
FIG. 5 is a cross section view of the light emitting device taken along a line 5-5 of FIG. 4.

FIG. 4 is a top view of a light emitting device 200 obtained using the manufacturing method of the present embodiment. Also, FIG. 5 is a cross section view of line 5-5 in FIG. 4. Furthermore, FIG. 6A to FIG. 6D are drawings for illustrating the method for manufacturing the light emitting device 200. Other than the members explained hereafter, the method for manufacturing the light emitting device 200 is substantially the same as those explained in the first embodiment except for the explanation hereafter.

Figure 6A:
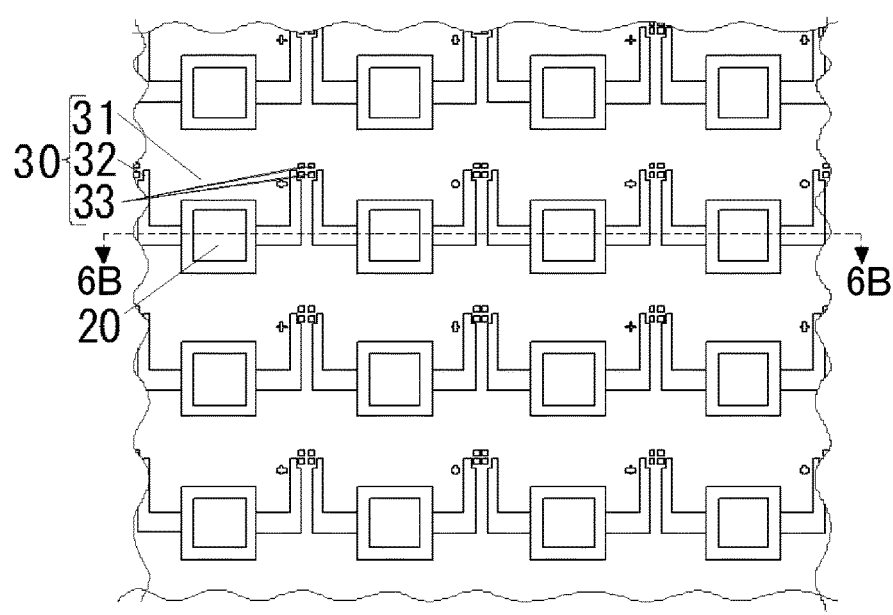
FIG. 6A is an enlarged partial top view for illustrating the method for manufacturing a light emitting device of the second embodiment.
Figure 6B:
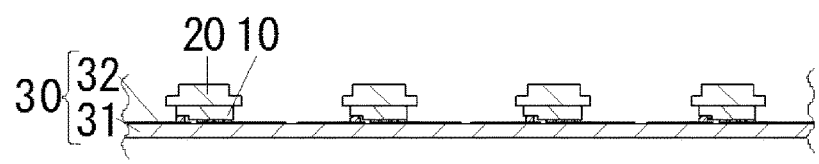
FIG. 6B is a cross section view taken along a line 6B-6B of FIG. 6A.
Figure 6C:
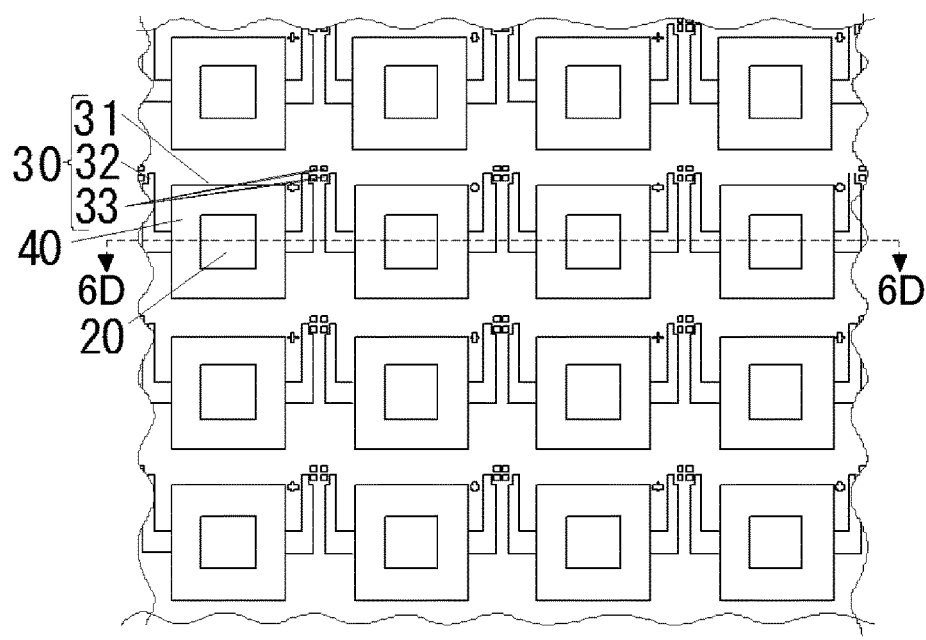
FIG. 6C is an enlarged top view for illustrating the method for manufacturing a light emitting device of the second embodiment.
Figure 6D:
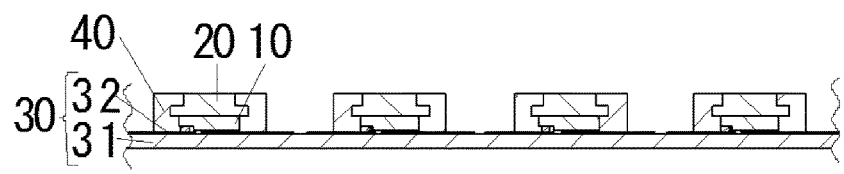
FIG. 6D is a cross section view taken along a line 6D-6D of FIG. 6C.

The method for manufacturing the light emitting device 200 is substantially the same as the method illustrating using FIG. 3A to FIG. 3J before the step for removing a portion of the light transmissive piece 20. Then, at the step for removing a portion of the light transmissive piece 20, as shown in FIG. 6A and FIG. 6B, a portion of the light transmissive piece 20 is removed such that the area of the top surface of the light transmissive piece 20 is smaller than the area of the bottom surface of the light transmissive piece 20. In the present embodiment, as shown in FIG. 6B, a portion of the light transmissive piece 20 is removed in such a manner as to be a convex shape to upward of the light transmissive piece 20. In specific terms, a portion of the light transmissive piece 20 is removed such that the light transmissive piece 20 has: a top surface, a first lateral surface extending downward continuous from the top surface, a middle surface extending to the outside in parallel to the top surface continuous from the first lateral surface, a second lateral surface extending downward continuous from the middle surface, and a bottom surface extending in parallel to the top surface continuous from the inside from the second lateral surface. At this time, the first lateral surface is positioned inner side of the lateral surface of the light emitting element 10, and the second lateral surface is positioned outer side of the top surface of the light emitting element 10 with a top view. In other words, with a top view, the outer edge of the top surface of the light transmissive piece 20 is positioned inner side of the outer edge of the top surface of the light emitting element 10, and the outer edge of the bottom surface of the light transmissive piece 20 is positioned outer side of the outer edge of the top surface of the light emitting element 10. Then, as shown in FIG. 6C and FIG. 6D, at the step for providing the light reflective member 40, the light reflective member 40 is provided in such a manner as to cover the exposed surface of the light transmissive piece 20 excluding the top surface of the light transmissive piece 20 and the exposed surface of the light emitting element 10.

By removing a portion of the light transmissive piece 20 such that the top part of the light transmissive piece 20 becomes a convex shape, the light emitting surface can be smaller, thereby enabling increase of the luminance. Also, using the light emitting device 200 in which the light transmissive piece 20 with the top part being a convex shape and the light emitting element 10 are joined, in the case where directly joining the light transmissive piece 20 and the light emitting element 10 by adding pressure after processing the light transmissive piece 20 to a convex shape, the light transmissive piece 20 may be damaged due to concentration of force on the protruding part of the light transmissive piece 20. In contrast to this, by making the top part of the light transmissive piece 20 be a convex shape after joining, the light transmissive piece 20 is less likely to be damaged. Also, in the case of the light transmissive piece 20 in which one or more phosphors are contained, it can be employed that the outer edge of the bottom surface of the light transmissive piece 20 being positioned outer side of the outer edge of the top surface of the light emitting element 10. This can realize that all the light from the light extraction surface of the light emitting element 10 passes through the light transmissive piece 20, thereby mitigating the occurrence of color non-uniformity.

In the cross section view, the length of the first lateral surface (distance in the vertical direction of the first lateral surface) can be in a range of from 50 µm to 150 µm, for example. By having the length be the above-mentioned lower limit value or greater, it is easier to ensure the thickness of the light reflective member 40 above the middle surface, thereby alleviating in light output from the area other than the top surface of the light transmissive piece 20. Also, by employing a length of the above-mentioned upper limit value or less, it can alleviate difficulty in light extraction from the light emitting element 10 caused by that the thickness of the light transmissive piece 20 becoming too large.

In the present embodiment, in the cross section view, a portion of the light transmissive piece 20 is removed such that the length of the second lateral surface is longer than the length of the first lateral surface. This can easily ensure the thickness from the bottom surface of the light transmissive piece 20 to the middle surface of the light transmissive piece 20, thereby readily alleviating an instance that the light from the light emitting element 10 is extracted to the outside without undergoing wavelength conversion.

The light emitting device described in the embodiments herein can be used for lighting apparatus and on-vehicle lighting apparatus.

What is claimed is:

1. A method for manufacturing a light emitting device comprising:
   joining a light transmissive substrate and two or more light emitting elements with top surfaces of the light emitting elements facing a bottom surface of the light transmissive substrate;
   separating the light transmissive substrate into a plurality of light transmissive pieces such that one or more of the light emitting elements remains in a state joined to one of the light transmissive pieces after separation;
   mounting the one or more of the light emitting elements joined to the one of the light transmissive pieces on a mounting unit, with a bottom surface of the one or more of the light emitting elements facing a top surface of the mounting unit;
   removing a portion of the one of the light transmissive pieces joined with the one or more of the light emitting elements mounted on the mounting unit such that a top surface of the one of the light transmissive pieces becomes a predetermined shape; and
   after the removing of the portion of the one of the light transmissive pieces, separating the mounting unit into a plurality of board pieces such that one or more of the light transmissive pieces remain on one of the board pieces after separation.

2. The method for manufacturing a light emitting device according to claim 1, wherein
   the mounting of the one or more of the light emitting elements on the mounting unit includes mounting a plurality of sets of one or more of the light emitting elements respectively joined to the light transmissive pieces on a mounting board as the mounting unit, and
   the removing of the portion of the one of the light transmissive pieces includes removing a portion of each of the light transmissive pieces.

3. The method for manufacturing a light emitting device according to claim 2, wherein
   the mounting of the one or more light emitting elements on the mounting unit includes using the mounting unit having a recognition mark as the mounting unit, and
   the removing of the portion of the one of the light transmissive pieces includes removing the portion of the one of the light transmissive pieces using the recognition mark as reference.

4. The method for manufacturing a light emitting device according to claim 1, wherein
   the removing of the portion of the one of the light transmissive pieces includes removing the portion of the one of the light transmissive pieces such that an area of the top surface of the one of the light transmissive pieces is smaller than an area of a bottom surface of the one of the light transmissive pieces.

5. The method for manufacturing a light emitting device according to claim 3, wherein
   the removing of the portion of the one of the light transmissive pieces includes removing the portion of the one of the light transmissive pieces such that the one or more light emitting elements joined to the one of the light transmissive pieces remains in a state joined with the bottom surface of the one of the light transmissive pieces at a position inner side of an outer edge of the bottom surface of the one of the light transmissive pieces.

6. The method for manufacturing a light emitting device according to claim 5, wherein
   the removing of the portion of the one of the light transmissive pieces includes removing the portion of the one of the light transmissive pieces such that the one of the light transmissive pieces includes a top surface, a first lateral surface extending downward continuous from the top surface, a middle surface extending to the outside in parallel to the top surface continuous from the first lateral surface, a second lateral surface extending downward continuous from the middle surface, and a bottom surface extending in parallel to the top surface continuous from the inside from the second lateral surface.

7. The method for manufacturing a light emitting device according to claim 6, wherein
   the removing of the portion of the one of the light transmissive pieces includes removing the portion of the one of the light transmissive pieces such that a length of the first lateral surface is in a range of from 50 μm to 150 μm.

8. The method for manufacturing a light emitting device according to claim 1, wherein
   the joining of the light transmissive substrate and the two or more light emitting elements includes using a ceramic substrate that contains phosphor as the light transmissive substrate.

9. The method for manufacturing a light emitting device according to claim 1, wherein
   the joining of the light transmissive substrate and the two or more light emitting elements is performed by using a surface activated bonding method or an atomic diffusion bonding method.

10. The method for manufacturing a light emitting device according to claim 1, further comprising,
    before the joining of the light transmissive substrate and the two or more light emitting elements, temporarily fixing the two or more light emitting elements on a support substrate with bottom surfaces of the two or more light emitting elements facing a top surface of the support substrate, wherein
    the temporarily fixing of the two or more light emitting elements on the support substrate includes providing resin at a thickness in a range of from 15 μm to 50 μm between the bottom surfaces of the two or more light emitting elements and the top surface of the support substrate for temporary fixing.

11. The method for manufacturing a light emitting device according to claim 10, wherein
    an electrically conductive silicon wafer is used as the support substrate.

12. The method for manufacturing a light emitting device according to claim 11, wherein
    the joining of the light transmissive substrate and the two or more light emitting elements includes holding the support substrate by using an electrostatic chuck, and joining the light transmissive substrate and the two or more light emitting elements by using the surface activated bonding method.

13. The method for manufacturing a light emitting device according to claim 11, wherein
a silicone resin is used as the resin.

14. The method for manufacturing a light emitting device according to claim 13, wherein
a distance between one of the light emitting elements and an adjacent light emitting element is in a range of from 100 μm to 500 μm.

15. The method for manufacturing a light emitting device according to claim 1, wherein
the removing of the portion of the one of the light transmissive pieces includes removing the portion of the one of the light transmissive pieces such that the top surface of one of the light transmissive pieces is a quadrilateral shape.

16. The method for manufacturing a light emitting device according to claim 1, wherein
the joining of the light transmissive substrate and the two or more light emitting elements includes using a ceramic substrate that contains phosphor as the light transmissive substrate.

17. The method for manufacturing a light emitting device according to claim 1, wherein
the joining of the light transmissive substrate and the two or more light emitting elements includes using the light transmissive substrate having a height in a range of from 150 μm to 250 μm.

18. The method for manufacturing a light emitting device according to claim 1, wherein
the removing of the portion of the one of the light transmissive pieces is performed by using a blade or a laser.

* * * * *